United States Patent [19]

Sakharov et al.

[11] Patent Number: 6,005,331
[45] Date of Patent: Dec. 21, 1999

[54] MONOLITHIC CRYSTAL FILTER

[75] Inventors: Sergei Alexandrovich Sakharov; Andrei Valerievich Medvedev; Jury Vladimirovich Pisarevsky; Valentin Petrovich Litvinov, all of Moscow, Russian Federation

[73] Assignee: Rafida Development Incorporated, British Virgin Island, United Kingdom

[21] Appl. No.: 08/981,036

[22] PCT Filed: Mar. 1, 1996

[86] PCT No.: PCT/RU96/00044

§ 371 Date: Dec. 10, 1997

§ 102(e) Date: Dec. 10, 1997

[87] PCT Pub. No.: WO96/34454

PCT Pub. Date: Oct. 31, 1996

[30] Foreign Application Priority Data

Apr. 27, 1995 [RU] Russian Federation ............. 95106130

[51] Int. Cl.⁶ ............................................ H03H 9/56
[52] U.S. Cl. ............................................ 310/360; 310/366
[58] Field of Search ............................... 310/360, 366, 310/320

[56] References Cited

U.S. PATENT DOCUMENTS

| | | | |
|---|---|---|---|
| 4,542,355 | 9/1985 | Ballato | 333/191 |
| 5,557,968 | 9/1996 | Krempl et al. | 310/361 |
| 5,578,759 | 11/1996 | Clayton | 73/702 |
| 5,821,673 | 10/1998 | Pisarevsky et al. | 310/360 |
| 5,847,435 | 12/1998 | Ballato et al. | 257/417 |

FOREIGN PATENT DOCUMENTS

| | | | |
|---|---|---|---|
| A1 0516400 | 12/1992 | European Pat. Off. | H03H 9/19 |
| 1523518 | 5/1968 | France | H03H 9/56 |
| 997231 | 2/1983 | U.S.S.R. | H03H 9/56 |
| A1 1780147 | 12/1992 | U.S.S.R. | H03H 9/56 |

OTHER PUBLICATIONS

Translation of priority document RU 95106130.
Translation of claim of SU 1780147 cited in the International Search Report.
Translation of claim of SU 997231 cited in the International Search Report.
Pages 83 and 84 of textbook cited on p. 1 of Specification, plus translation of first paragraph.

*Primary Examiner*—Thomas M. Dougherty
*Attorney, Agent, or Firm*—Nexsen Pruet Jacobs & Polland, LLP

[57] ABSTRACT

The present invention relates to radioelectronics and can find application in developing signal frequency discriminators. According to the invention, the filter comprises a piezoelectric-crystal plate 1 made of La—Ga silicate, two pairs of overlap exciting electrodes 2, 3 and 4, 5, and leads 6. There were selected experimentally in the proposed filter such a ratio between the length of the electrodes along the axis of acoustical coupling, the area of the electrodes, and the wafer thickness that makes it possible to extend the filter frequency range towards higher frequencies. The proposed filter construction provides for a higher temperature stability of the filter average frequency in a wide range of above-zero temperatures, and a reduced level of side passbands.

3 Claims, 2 Drawing Sheets

MONOLITHIC CRYSTAL FILTER

TECHNICAL FIELD

The present invention relates to radioelectronics, more specifically it concerns piezoelectric engineering and can find application in signal frequency discriminators, as well as in developing and manufacture of medium-passband monolithic crystal filters (MCF).

BACKGROUND ART

Known in the present state of the art is a monolithic filter on a crystalline plate from La—Ga silicate (LGS) made on a straight XY-cut. Relative dimensions of the exciting electrodes are in this case as follows:

$$\frac{Lx}{H} = 6 \quad \frac{Lz}{H} = 12$$

where

Lx is the electrode dimension along electric axis X, m;

Lz is the electrode dimension along electric axis Z, m;

Lz is the thickness of the piezoelectric-crystal plate, m.

(cf. the textbook "Monolithic filters and resonators on a new Ga—La silicate piezoelectric". In: Electronic engineering. Series "Radioelectronic parts and components", Issue 2 (63), 1986, p.83 (in Russian).

A disadvantage inherent in the known filter resides in a relatively low value of a medium-passband frequency of the filter passband which is not in excess of 20 MHz, this being due to unoptimally selected dimensions of the electrodes with respect x to thickness of the piezoelectric-crystal plate.

One more prior-art monolithic crystal filter is known to comprise at least two acoustically coupled resonators, either of which is established by two overlap exciting electrodes situated on the major faces of a piezoelectric La—Ga silicate wafer of the YXl/±β° cut, the axis of acoustical coupling therebetween is arranged along the length of the piezoelectric-crystal plate. An angle between the normal to the major wafer face and its mechanical axis Y is selected to be 1° 50'±1°, and the length and width of rectangular-shaped exciting electrodes are selected, respectively, from the following relations:

$$8.0 \leq \frac{Lx}{H} \leq 10.5$$

$$6.5 \leq \frac{Lz}{H} \leq 8.0,$$

where

Lx is the length of exciting electrodes along X axis, m;

Lz is the width of exciting electrodes along Z axis, m;

H is the thickness of the piezoelectric-crystal plate, m;

(cf. SU, A, #1,780,147, IPC H03H 9/56, 1990).

A disadvantage of the known filter is a relatively low value of a medium-passband frequency of the filter passband which is not in excess of 20 MHz, this being due to the fact that preselected ratio between the length and width of exciting electrodes, and the thickness of the piezoelectric-crystal plate makes it impossible to realize a technologically small interelectrode gap which is liable to decrease significantly with a frequency raise and with the aforementioned dimensional relations of electrodes; In addition, with a frequency raise discrimination of the filter decreases due to an increase in the level and number of side passbands. Moreover, the aforesaid angle between the normal to the face of the major piezoelectric-crystal plate and its mechanical axis Y equal to 1° 50'±1°, fails to provide high temperature stability of the filter medium passband frequency in a wide range of above-zero temperatures.

DISCLOSURE OF THE INVENTION

The present invention has for its principal object to provide a monolithic crystal filter having such a construction arrangement that is instrumental in increasing the medium passband medium, enhancing temperature stability of said medium passband frequency in a wide range of above-zero temperatures, and increasing filter discrimination, which is attained due to a reduced level of side passbands in the filter rejection bands, with the maximum filter transmission band remaining unaffected.

The foregoing object is accomplished due to the fact that in a monolithic crystal filter, comprising at least two acoustically coupled resonators, either of which is established by two overlap exciting electrodes situated on the major faces of a piezoelectric La—Ga silicate wafer of the cut YXl/±β°, the axis of acoustical coupling therebetween is arranged along the length of the piezoelectric-crystal plate, according to the invention, the length and area of the electrodes are selected, respectively, from the following relations:

$$10.5 \leq \frac{Lx}{H} \leq 18,$$

$$8.4 \leq \frac{S}{H^2} \leq 200,$$

where

Lx is the length of exciting electrodes along X axis, m;

H is the thickness of the piezoelectric-crystal plate, m;

S is the area of the exciting electrodes, m².

An enhanced temperature stability of the medium passband frequency is attained due to selecting angle β between the normal to the major face of the piezoelectric-crystal plate and its mechanical axis to be within −50'<β<50'.

An increased filter discrimination is attained by rotating the piezoelectric-crystal plate round the normal to the major face through an angle α which is to be selected within the range of 0<α<15°.

According to the invention, there were selected experimentally in the proposed filter such a ratio between the length of electrodes along the axis of acoustical coupling and the wafer thickness that makes it possible to extend the filter frequency range towards higher frequencies.

To increase the filter frequency range in the prototype towards higher frequencies it would be necessary to reduce the interelectrode spacing. However, at a frequency of 18 to 20 MHz the interelectrode gap is as small as 100 to 120 microns. Further decreasing of the interelectrode gap in the prototype cannot be carried into effect for technological reasons, since the electrodes are evaporation-deposited through masks whose conduit cannot be made still finer.

Studies into experimental relationships of a temperature coefficient of the medium passband frequency have evidenced that the proposed filter offers a maximum stability in the range of above-zero temperatures when the magnitude of angle α is selected from the range of −50'≤β<50'. A relative drift of the medium passband frequency equals 66×10⁻⁶.

With an increase in the filter medium passband frequency the number of side passbands is increased, too, while their attenuation decreases. To compensate for attenuation pf the side passbands and hence to enhance the filter discrimination is attained by rotating the piezoelectric-crystal plate about the normal to the major face through an angle α which is to be selected from an experimentally found range of 0<α≤15° within which an acoustical coupling factor is not virtually reduced. In this case a high value of the acoustical coupling factor makes it possible neither to reduce the passband width nor to render filter passband narrower as to higher frequencies.

Thus, the herein-proposed construction arrangement of a monolithic crystal filter provides for an extension of the frequency range thereof towards higher frequencies to as high as 80 MHz, as well as a higher temperature stability in a wide range of above-zero temperatures and a reduced level of side passbands.

BRIEF DESCRIPTION OF THE DRAWINGS

In what follows the present invention will now be disclosed in a detailed description of an illustrative embodiment thereof with reference to the accompanying drawings, wherein.

Figure 1:
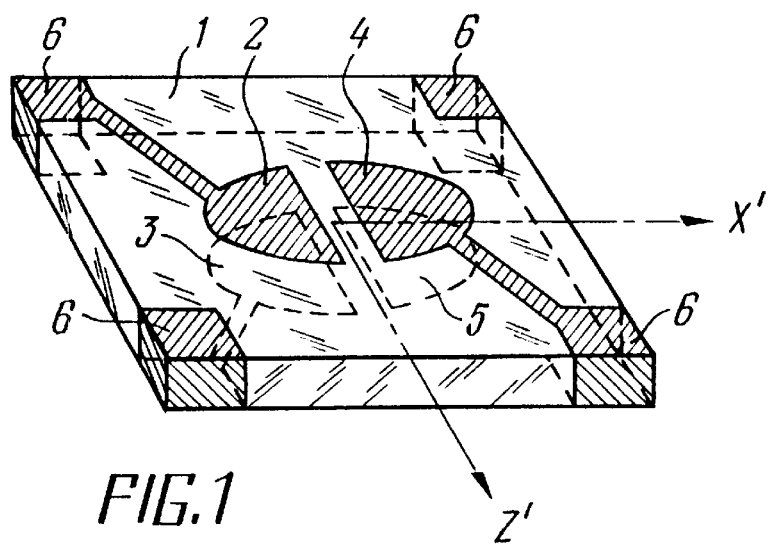
FIG. 1 is a view of a construction arrangement of the piezoelement of a monolithic crystal filter, according to the invention.
Figure 2:
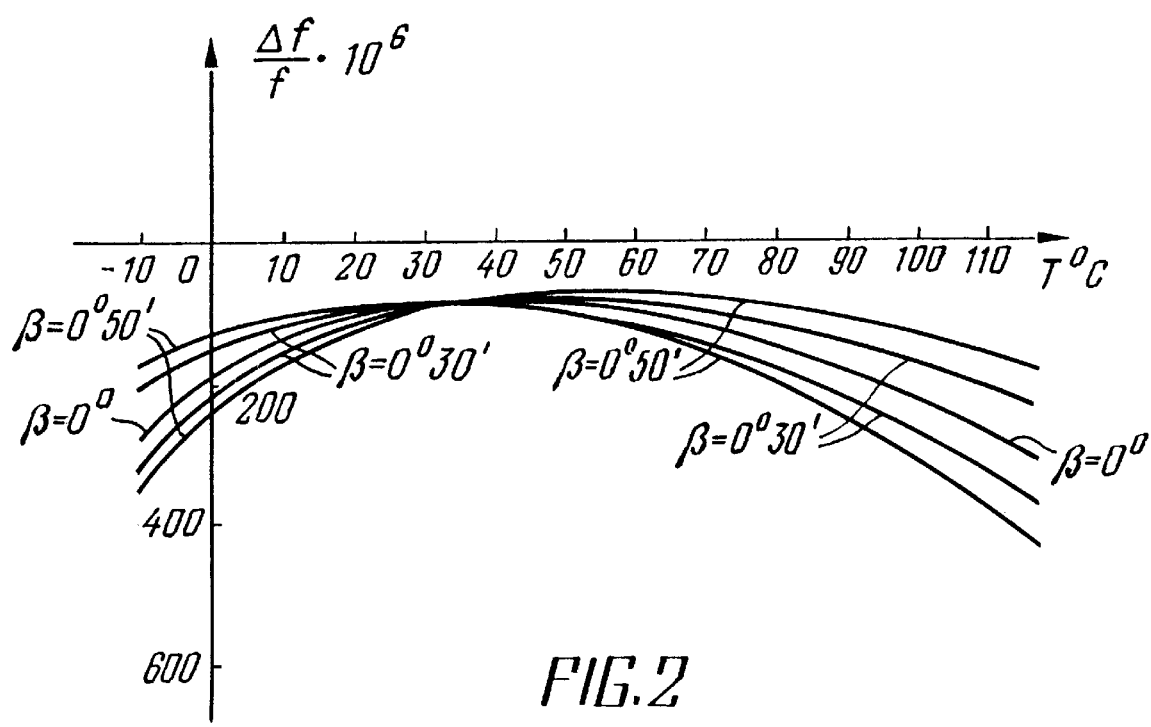
FIG. 2 is a graphic representation of experimental relationships of a temperature coefficient of the filter medium passband frequency $$\left(\frac{\Delta f}{f}\right)$$
Figure 3:
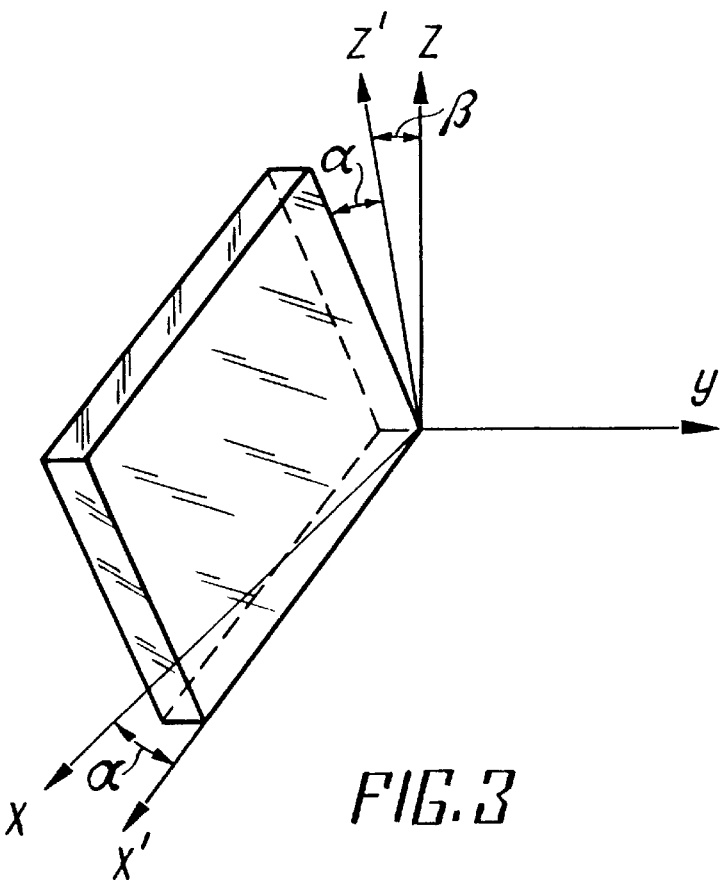
Figure 4:
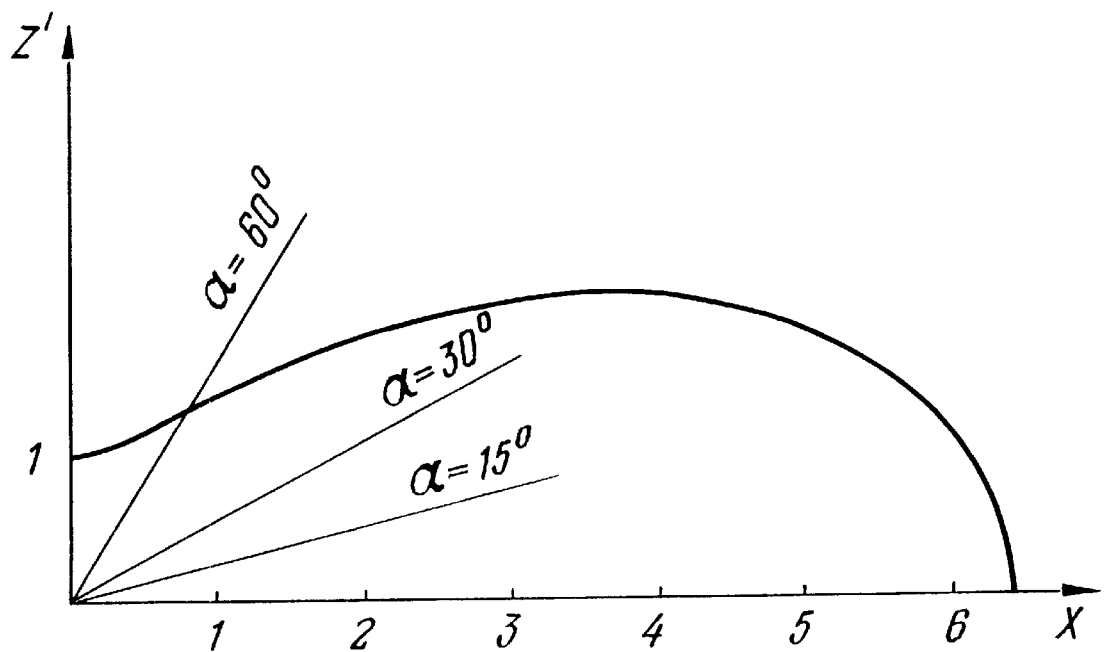

in the region of above-zero temperatures, according to the invention;

FIG. 3 presents orientation of a piezoelectric-crystal plate relative to crystallographic axes of an LGS crystal, according to the invention; and FIG. 4 is a view, in a polar coordinate system, an acoustical coupling factor in the ZX plane of the LGS crystal on the basis of Z axis.

BEST METHOD OF CARRYING OUT THE INVENTION

The herein-proposed monolithic crystalline filter (MCF) comprises a piezoelectric-crystal plate 1 made of La—Ga silicate, two pairs of overlap exciting electrodes 2, 3 and 4, 5, respectively, and leads 6.

To make the proposed filter there is prepared a crystalline wafer of the YXl/10' cut 4 mm in diameter with a flat oriented along the crystallographic axis X. The thickness of the crystalline wafer is estimated on the basis of a frequency constant for a given orientation.

A pair of the acoustically coupled electrodes with leads is applied to the major faces of the crystalline wafer, said coupling being directed along X axis.

The electrode dimension along X axis, L=0.21 mm, that along Z axis, Lz=0.28 mm, the electrode area S=0.0588 mm$^2$, the interelectrode spacing, being 0.10 mm. The crystalline wafer with the electrodes is enclosed in a standard HC-49 package, whereupon the filter is adjusted and the package is evacuated and hermetically sealed. The filter under consideration has a medium passband frequency of 71 MHz and a 85 kHz passband at the 3 B level.

The present monolithic crystal filter operates as follows. A radio-frequency voltage is applied to the input leads 6 of the exciting electrodes 2 and 3 of the input frequency resonator and sets thickness-shear vibrations therein, which are transmitted, by virtue of acoustical coupling, to an the adjacent frequency resonator established by the exciting electrodes 4 and 5, whence said vibrations arrive at the output leads 6 of the piezoelement of the monolithic crystal filter.

Industrial Applicability

The herein-proposed monolithic filter based on the crystals of La—Ga silicate (langasite) can find widespread application in the channels of intermediate-frequency amplifiers of radioreceiving- and transmitting equipment, in particular, for portable or mobile radiophones, pagers, personal-use radio sets, as well as in any radio systems making use of the digital method of signal processing.

We claim:

1. A monolithic crystal filter, comprising:

a piezoelectric-crystal plate having a first and a second major face, an electric X axis, a mechanical Y axis, a longitudinal axis of symmetry, a thickness, a length, and an area;

said piezoelectric-crystal plate so oriented that an angle β is defined between a normal to said first major face and said mechanical Y axis in an XY plane, and a first angle α of rotation is defined between said longitudinal axis of symmetry and the electric X axis;

said piezoelectric-crystal plate made of lanthanum-gallium silicate of the YX1/±β° cut;

a plurality of overlap exciting electrodes set in pairs; at least two of said pairs of said overlap exciting electrodes: a first of said two pairs, comprising a first electrode situated on said first major face, and a second electrode arranged on said second major face; a second of two pairs, comprising a third electrode located on said first major face, and a fourth electrode disposed on said second major face;

a plurality of resonators; at least two of said plurality of resonators; a first of said two resonators established by said first pairs of said overlap exciting electrodes; a second of said two resonators formed by said second pairs of said overlap exciting electrodes and optically coupled to said first resonator;

said first and second resonators having an axis of acoustical coupling therebetween, said axis running along said length of said piezoelectric-crystal plate;

each of said plurality of overlap exciting electrodes having a length and an area and selected from the following relations:

10.5<Lx/H<18;

84<S/H$^2$<200, where:

Lx is the dimension of each of said overlap exciting electrodes along said length of said piezoelectric-crystal Plate;

H is said thickness of said piezoelectric-crystal plate;

S is said area of said piezoelectric-crystal plate;

an input lead of each of said overlap exciting electrodes;

an output lead of said piezoelectric crystal plate.

2. A monolithic crystal filter as set forth in claim 1, wherein said angle between a normal to said first major face of said piezoelectric-crystal plate and said mechanical Y axis in an XY plane is selected in the range of −50'≦β°<50'.

3. A monolithic crystal filter as set forth in claim 1, comprising said piezoelectric-crystal plate, wherein said first angle of rotation defined between said longitudinal axis of symmetry and the electric X axis is selected in the range of 0°<α<15°.

* * * * *